US012728832B2

(12) United States Patent
Cuesta Castro et al.

(10) Patent No.: US 12,728,832 B2
(45) Date of Patent: Sep. 8, 2026

(54) AIRCRAFT BRAKE CONTROL SYSTEM

(71) Applicant: AIRBUS OPERATIONS LIMITED, Bristol (GB)

(72) Inventors: Carlos Cuesta Castro, Bristol (GB); Andrew Hebborn, Bristol (GB)

(73) Assignee: AIRBUS OPERATIONS LIMITED, Bristol (GB)

( * ) Notice: Subject to any disclaimer, the term of this patent is extended or adjusted under 35 U.S.C. 154(b) by 992 days.

(21) Appl. No.: 17/598,183

(22) PCT Filed: Jul. 16, 2020

(86) PCT No.: PCT/EP2020/070198
§ 371 (c)(1),
(2) Date: Sep. 24, 2021

(87) PCT Pub. No.: WO2021/018622
PCT Pub. Date: Feb. 4, 2021

(65) Prior Publication Data

US 2022/0176934 A1 Jun. 9, 2022

(30) Foreign Application Priority Data

Jul. 31, 2019 (GB) ..................................... 1910945

(51) Int. Cl.
*G01L 5/28* (2006.01)
*B60T 7/12* (2006.01)
(Continued)

(52) U.S. Cl.
CPC .............. *B60T 17/221* (2013.01); *B60T 7/12* (2013.01); *B60T 8/325* (2013.01); *B64C 25/44* (2013.01);
(Continued)

(58) Field of Classification Search
None
See application file for complete search history.

(56) References Cited

U.S. PATENT DOCUMENTS 4,912,969 A * 4/1990 Ishizeki .................. B60T 8/885 303/122.08
6,704,634 B1 3/2004 Gowan et al.
(Continued)

FOREIGN PATENT DOCUMENTS

CN 109632337 4/2019
DE 102014213208 A1 * 1/2016 .............. B60T 17/22
(Continued)

OTHER PUBLICATIONS

International Search Report for PCT/EP2020/070198 dated Nov. 13, 2020, 3 pages.

(Continued)

*Primary Examiner* — Stephen D Meier
*Assistant Examiner* — Ruben C Parco, Jr.
(74) *Attorney, Agent, or Firm* — Nixon & Vanderhye P.C.

(57) ABSTRACT

An aircraft brake control system for controlling a plurality of brakeable wheels of a landing gear. Each brakeable wheel includes a brake actuator and a wheel speed sensor. The system includes a controller configured to receive aircraft control parameters and provide brake commands to the brake actuator of each wheel. The controller being configured to activate pre-retraction braking in response to an aircraft control parameter indicating that landing gear retraction is required and execute a functional brake test during pre-retraction braking.

20 Claims, 7 Drawing Sheets

(51) Int. Cl.

| | |
|---|---|
| ***B60T 8/32*** | (2006.01) |
| ***B60T 17/22*** | (2006.01) |
| ***B64C 25/44*** | (2006.01) |
| ***G01R 31/55*** | (2020.01) |

(52) U.S. Cl.

CPC ..... *B60T 2240/00* (2013.01); *B60T 2270/406* (2013.01); *B60T 2270/413* (2013.01); *G01R 31/55* (2020.01)

(56) References Cited

U.S. PATENT DOCUMENTS

| | | | | |
|---|---|---|---|---|
| 6,851,649 | B1 * | 2/2005 | Radford | B60T 8/325 188/264 R |
| 9,199,615 | B2 | 12/2015 | Cahill | |
| 2010/0106347 | A1 * | 4/2010 | Cahill | B64C 25/44 701/3 |
| 2013/0060404 | A1 | 3/2013 | Cahill | |
| 2018/0111430 | A1 * | 4/2018 | Muddiman | B60C 23/0488 |
| 2020/0172066 | A1 * | 6/2020 | Burte | B60T 8/1703 |

FOREIGN PATENT DOCUMENTS

| | | | | |
|---|---|---|---|---|
| EP | 0384071 | A1 * | 8/1990 | |
| EP | 1 418 122 | | 5/2004 | |
| EP | 2565093 | A1 * | 3/2013 | B60T 17/221 |
| EP | 3 530 565 | | 8/2019 | |
| RU | 2487807 | C2 * | 7/2013 | B60T 13/662 |
| WO | 00/69721 | | 11/2000 | |

OTHER PUBLICATIONS

Written Opinion of the ISA for PCT/EP2020/070198 dated Nov. 13, 2020, 8 pages.

* cited by examiner

AIRCRAFT BRAKE CONTROL SYSTEM

RELATED APPLICATION

This application is the U.S. national phase of International Application PCT/EP2020/070198, filed Jul. 16, 2020, which designated the U.S. and claims priority to United Kingdom patent application GB 1910945.3, filed Jul. 31, 2019, the entire contents of each of which are hereby incorporated by reference.

TECHNICAL FIELD

The present invention relates to aircraft brake control systems and methods of operating an aircraft brake system.

BACKGROUND

Aircraft landing gear comprise a plurality of wheels at least some of which are brakeable (which in the present context may be understood to mean a wheel which has an associated brake). In civil aircraft it is generally the main landing gear wheels that are brakeable, with the configuration of the wheels being dependent upon the size and type of aircraft. For example, a single-aisle civil aircraft (such as the Applicant's A320 family) may typically have a pair of main landing gear each having a pair of wheels in a twin arrangement on a common axle. A wide-body aircraft (such as the Applicant's A350 family) may have a pair of main landing gear each having a double axle with a pair of wheels on each axle.

The brake system associated with the landing gear typically comprises a brake actuator (which may be a plurality of actuators for redundancy) for each brake and a wheel speed sensor that may be used to provide feedback and may for example for use in an anti-skid system. For safety and/or reliability purposes, brake systems may utilise one or more test procedures. For example, the brake system may include pressure transducers which enable monitoring of the actuators in the brake system in a closed loop manner. Thus, for example, a pre-landing brake test may be performed during a landing approach in which the brakes are applied with the pressure transducers being used to monitor the resulting output from the brake actuators.

It will, however, be appreciated that it is desirable to provide additional or improved methods of testing braking systems. For example, a brake test using brake transducers may only provide a yes/no response test and may not for example be able distinguish between individual wheels braking response. For example, an aircraft braking system may in normal operation apply the same response on each wheel and may only apply differential wheel braking as part of an anti-skid system (which it may be appreciated would reducing braking on an individual wheel if a slip condition is detected).

Accordingly, at least some embodiments of the invention, seek to provide a brake system which may address or reduce at least some of the disadvantages of existing arrangements.

SUMMARY

A first aspect of the present invention provides an aircraft brake control system for controlling a plurality of brakeable wheels of a landing gear, each brakeable wheel comprising a brake actuator and a wheel speed sensor, wherein the system comprises a controller configured to receive aircraft control parameters and provide brake commands to the brake actuator of each wheel, the controller being configured to: a controller configured to receive aircraft control parameters and provide brake commands to the brake actuator of each wheel, the controller being configured to: activate pre-retraction braking in response to an aircraft control parameter indicating that landing gear retraction is required; and execute a functional brake test during pre-retraction braking.

It may be appreciated that on most commercial aircraft the plurality of brakeable wheels are the main landing gear wheels.

Pre-retraction braking is braking the aircraft wheels after take-off and prior to the landing gear retraction and may typically be automatically performed during the landing gear retraction sequence of an aircraft. For safety reasons it is undesirable to retract the landing whilst the wheels are spinning. As such, when landing gear retraction is commanded (following take-off) the brakes will normally be activated over a period of a few seconds to stop the wheels spinning. At the end of the pre-retraction braking window, the wheels will normally have fully stopped and the landing gear retraction proceeds. The inventors have now recognised that the pre-retraction braking provides a useful window in which a brake system in accordance with embodiments of the invention can implement functional brake tests.

Advantageously, performing brake testing during pre-retraction braking may be performed without placing significant additional burden on the braking system (such that for example additional unnecessary brake wear can be avoided). Further, the inventors have recognised that by performing brake testing during pre-retraction braking wheel speed data may be readily available. For example, many aircraft use a simple electrical generator tachometer as a speed sensor. Such sensors are robust and reliable but are a passive sensor which cannot provide any feedback when the wheels are stationary. Immediately following take-off, the aircraft wheels are freely spinning at a relatively high rotational speed. Thus, the inventors have recognised that brake testing at this time may be beneficial.

In some embodiments the functional brake test may comprise issuing sequential brake commands to the brake actuators of at least a first and a second brakeable wheel. This may cause the at least two brakeable wheels to be braked in sequence. The brake system may independently monitor the wheel speed sensors of each wheel. Advantageously, the use of sequential braking during the bake test may help to distinguish between the brake commands and responses for each wheel. For example, if a connector within the brake system has been incorrectly connected it would be possible to detect that the incorrect wheel was being braked in comparison to the instructed brake command.

Issuing sequential brake commands may be comprise issuing a first brake command to at least a first of the brakeable wheels and issuing a second brake command to at least a second of the brakeable wheels a pre-determined time after the first brake command. The delay between the first and second brake command may be selected to be sufficient to allow a clear monitoring of the response of the braked wheels (but may also be selected to be small enough a delay to not overly impact the overall pre-retraction braking time).

The at least a first of the brakeable wheels and the at least a second of the brakeable wheels may each comprise a plurality of brakeable wheels. Thus, in some embodiments the first brake command is issued to a first group of the brakeable wheels and the second brake command is issued to a second group of the brakeable wheels.

It may be appreciated that the wheels on an aircraft are generally configured in a plurality of sets of wheels. For example, wheels may be provided as twin-pairs of wheels, and the pairs may in turn be arranged on a plurality of landing gear assemblies. It may be particularly beneficial to provide a brake system which can perform a functional brake test which is able to distinguish between the brakes within a set of wheels (e.g. the two wheels in a pair). For example, if a misconfiguration has been made within the brake system it is most likely to occur between the wheels within a set. Accordingly, in some embodiments, wheels within the first and second groups of brakeable wheels are selected such that wheels in a set of wheels on the aircraft, for example pairs of wheels on the aircraft, are in separate groups. In this way it may be possible to avoid needing to separate the wheels into more than two groups but for the functional brake test, yet still ensure that the response of the wheels can be easily identified.

The inventors have identified that to ensure that meaningful or reliable brake testing can be carried out whilst also ensuring that pre-retraction braking is performed without unnecessary extra strain or wear on the brakes, it may desirable for the controller to ensure that conditions meet pre-set requirements before performing the brake test. If the requirements are not met, the controller may simply proceed with pre-retraction braking in a conventional manner without executing a brake test. Thus, in some embodiments, the controller may be configured to confirm that a wheel speed indicated by at least one of the wheel speed sensors is above a pre-determined threshold value, prior to executing a functional brake test. Depending upon the embodiment, the controller may either cancel the brake test entirely if any wheel is not above the pre-determined threshold value or may exclude a specific wheel or wheels from the test.

The controller may compare the detected speeds indicated by respective ones of the speed sensors. This may for example be useful in identifying wheels which are not performing in an expected manner. For example, if one wheel is rotating at a lower speed than the other wheel prior to pre-retraction braking this could be an indicator of a fault or deterioration in that wheel's bearings. Likewise, if one wheel is found to brake more slowly than other wheels under the same brake command this may be indicative of an issue with the brake on that wheel. The controller may also be configured to issue a notification when a wheel speed detected by one of the wheel speed sensors does not conform to an expected response speed under the brake actuation commands issued during the functional brake test. The controller may flag or notify any such issues to an operator for further investigation. The notification may for example be local, provided on the aircraft, or may be provided through a networked health monitoring system in communication with the brake control system.

In some embodiments the controller may be configured to adapt at least one control parameter in response to the functional brake test. For example, in some brake systems it may be possible to adjust a brake actuator response if a brake is identified as performing below normal parameters. In some systems the brake system may include re-configurable manifolds—for example, control connections may be able to switch the hydraulic control or actuator to which they are in communication. In such systems the controller could re-map the connections in response to the functional brake test if a connection is found to be incorrectly configured.

According to a further aspect of the invention there is provided an aircraft landing gear system comprising: a plurality of wheels, each having: a brake including a brake actuator, and a wheel speed sensor; a gear retraction mechanism; and an aircraft brake control system in accordance with an embodiment.

A further aspect of the invention may provide an aircraft comprising a plurality of brakeable wheels, each brakeable wheel comprising a brake actuator and a wheel speed sensor, and the aircraft comprising an aircraft brake control system in accordance with an embodiment.

Another aspect of the invention provides a method of operating an aircraft braking system, the aircraft braking system including a plurality of brakeable wheels, each wheel comprising a brake actuator and a wheel speed sensor, the method comprising performing a functional brake test during pre-retraction braking, in response to a landing gear retraction command.

The functional brake test may comprise monitoring a speed; sequentially activating the brake actuators of the plurality of brakeable wheels; and monitoring a response of the wheel speed of each brakeable wheel to the sequential brake actuation. Monitoring a speed of the brakeable wheel may for example include monitoring the wheel speed deceleration profile after take-off The method may further comprise checking the speed of each brakeable wheel is above a threshold value prior to performing the functional brake test.

The method may comprise performing the functional brake test on a plurality of groups of wheels. At least one wheel in each group may be tested non-concurrently with the other wheels in its group of wheels. Testing at least one wheel in a first of the groups of wheels may be concurrent with at least one wheel in a second of the groups of wheels.

Another aspect of the invention comprises an aircraft brake system comprising: a plurality of brake actuators each associated with one of a plurality of wheels; a plurality of sensors to measure a speed of each of the plurality of wheels; and a processor, comprising an input for receiving aircraft system commands, an output for issuing instructions to the plurality of brake actuators; and a machine-readable medium comprising instructions executable by the processor in response to an input indicating landing gear retraction to: activate a first of the plurality of brake actuators, without activating a second of the plurality of brake actuators; and activate the second of the plurality of brake actuators after a pre-determined time delay following activation of the first brake actuator; and monitor the speed sensors of each of the plurality of wheels during the activation of both the first and second plurality of brake actuators.

Another aspect of the invention comprises an aircraft comprising an aircraft brake system in accordance with an embodiment.

Whilst the invention has been described above, it extends to any inventive combination of the features set out above or in the following description or drawings.

BRIEF DESCRIPTION OF THE DRAWINGS

Embodiments of the invention will now be described, by way of example only, with reference to the accompanying drawings, in which.

DETAILED DESCRIPTION

Figure 1A:
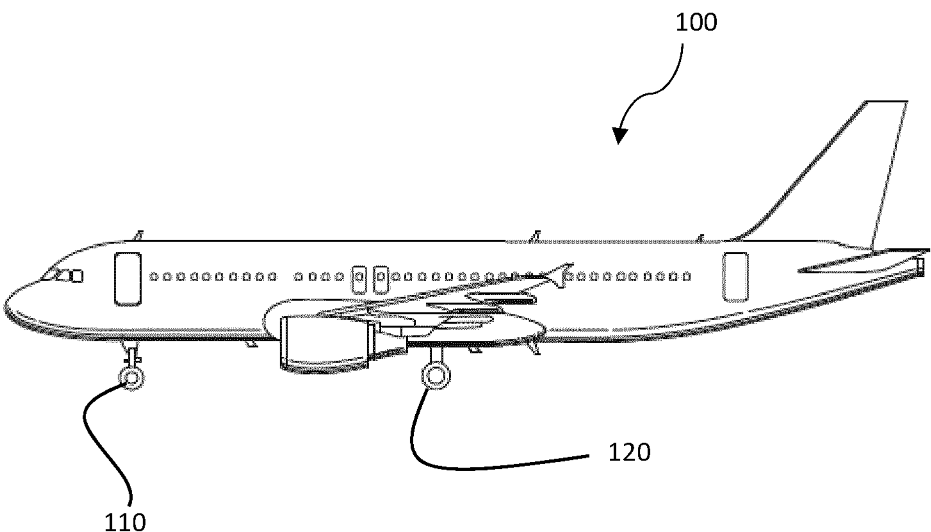
FIGS. 1A and 1B shows schematic views of a commercial aircraft in accordance with an embodiment.
Figure 1B:
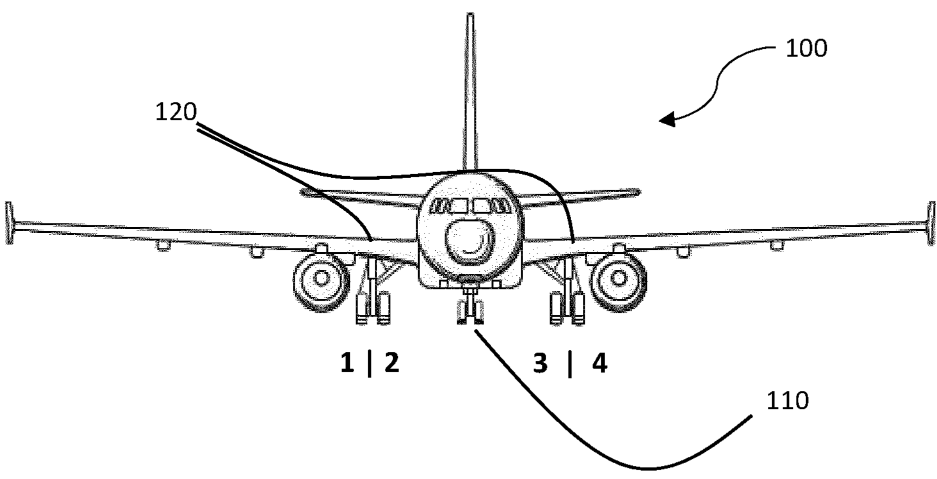

A commercial aircraft 100, in this case an example of the Applicant's A320 family, is shown in FIG. 1. The aircraft is provided with a nose landing gear 110 which carries a twin pair of wheels and a pair of main landing gear 120 each having a further twin pair of wheels. Typically, in most commercial aircraft the nose landing gear 110 is not provided with brakes as it only supports a relatively low proportion of the aircraft's weight. The main landing gears wheels are generally all provided with brakes (which will typically comprise hydraulically activated brakes having a stack of rotor and stator discs positioned within the hub of the wheel). In the present application a wheel with an associated brake is referred to as a brakeable wheel. It may be appreciated that the particular configuration of wheels and landing gear will depend upon the aircraft configuration and is not limiting in respect of the present invention. For example, a main landing gear may also include multiple sets of twin wheels and such arrangements are common on larger aircraft. The main landing gear wheels and associated brake systems are generally identified by being numbered. Thus, as seen on FIG. 1B the wheels on the main landing gear are numbered sequentially from left to right, when viewing the aircraft from the front, as wheels 1 to 4 and this numbering will be used in the following description.

Brakes are both safety critical systems and "rotable" components (i.e. components which must be changed, or "rotated", at frequent intervals) due to their wear during use. As such, it is important to be able to monitor or test brake performance without subjecting the brakes to additional unnecessary wear.

Figure 2:
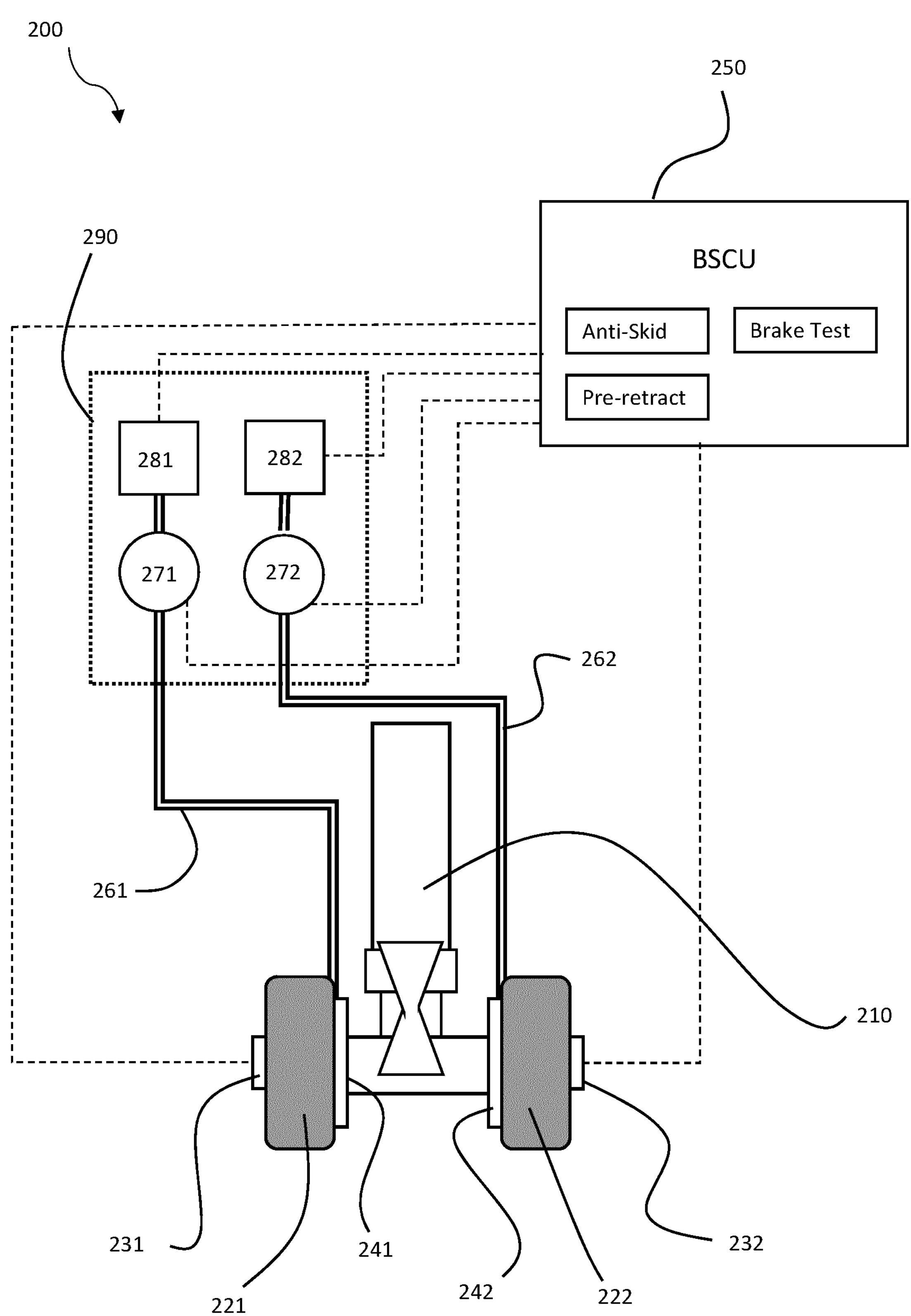
FIG. 2, shows a schematic representation of an aircraft braking system in accordance with an embodiment.

A brake system 200 in accordance with an embodiment is shown in FIG. 2. For clarity the system is shown on a single landing gear 210 but it will be appreciated that the wheels of the other landing gear would also be configured in the same manner. The example in FIG. 2 is the landing gear carrying wheels 1 and 2 (which will be referenced for this figure respectively as 221 and 222). The brake system 200 has a controller 250 which may be a Brake and Steering Control Unit and may have a number of functions such as anti-skid braking, pre-retraction braking and brake testing. The brake system 200 includes a brake 241, 242 and a wheel speed sensor 231 and 232 associated with each wheel 221 and 222. The wheel speed sensors 231 and 232 communicate with the controller 250. The wheel speed sensors 231 and 232 may be of any convenient arrangement but can, for example, be a tachometer of the electrical generator type which is embedded within the axle of the wheel.

The brakes 231 and 232 may be connected via hydraulic lines 261 and 262. Typically, a hydraulic manifold 290 is provided which may act as an interface between the hydraulic lines 261 and 262 and the controller 250. The manifold 290 may include actuators for each brake 241 and 242 in the form of respective hydraulic servos 281 and 282. Corresponding pressure transducers 271 and 272 may be provided for monitoring the response of the hydraulic system and can provide closed loop feedback on the actuation of the servos 281 and 282.

Figures 3A, 3B:
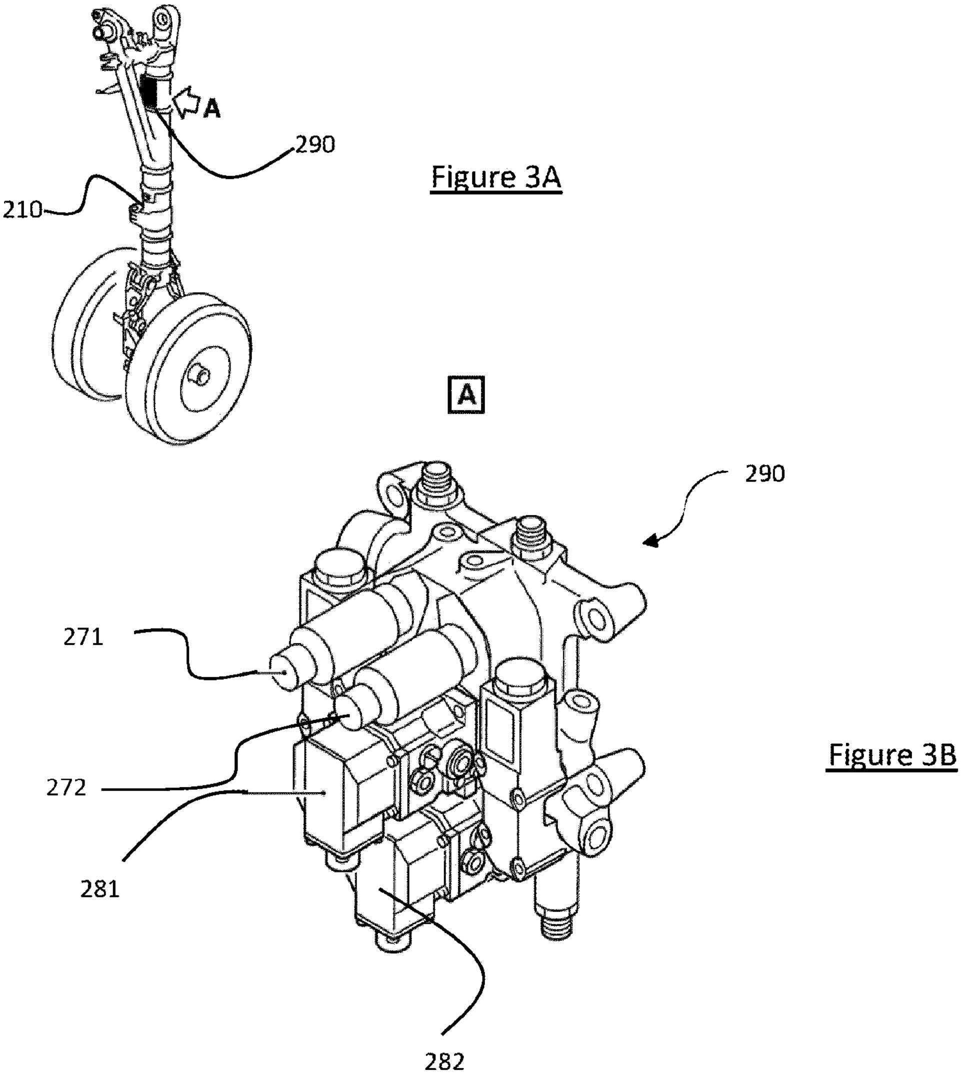
FIGS. 3A and 3B shows a typical physical configuration of an aircraft landing gear having a brake system manifold.

FIG. 3A and 3B illustrates the physical arrangement of the manifold 290. As can be seen in FIG. 3A, the manifold may be positioned in an upper portion of the landing gear 210. As best seen in FIG. 3B the manifold 290 includes connections for the transducers 271 and 272 and the servos 281 and 282. One specific error which can occur in use is for the connections to the transducers 271 and 272 or the servos 281 and 282 to be cross connected. In such a situation commands to one servo and responses detected in the other transducer are provided to the controller 250 as relating to the same wheel. Likewise, a cross-connection could also occur at the tachometers 231 and 232 particularly the pair on a common axle for a corresponding pair of wheels. Generally, such a cross connection will not be problematic as the brake commands to each wheel in a pair are generally the same. However, this also means that the cross-connection can go undetected. A cross-connection may only become apparent (and/or problematic) when the brake system antiskid system activates. The anti-skid system is activated when a tachometer 231 or 232 detects that a wheel speed is not matching the aircraft speed and therefore that a slip condition is occurring. The braking system 200 will then reduce the braking on the slipping wheel until the skid ceases. If there is a cross connection on either the servo valves or tachometer, there is a risk that the braking system 200 will reduce braking on a wheel which is not skidding because that wheel has been connected to the servo for the wheel which is subject to a skid. Embodiments of the invention may enable such cross-connections to be detected simply and easily by means of a routine brake test introduced during pre-retraction braking.

Figure 4A:
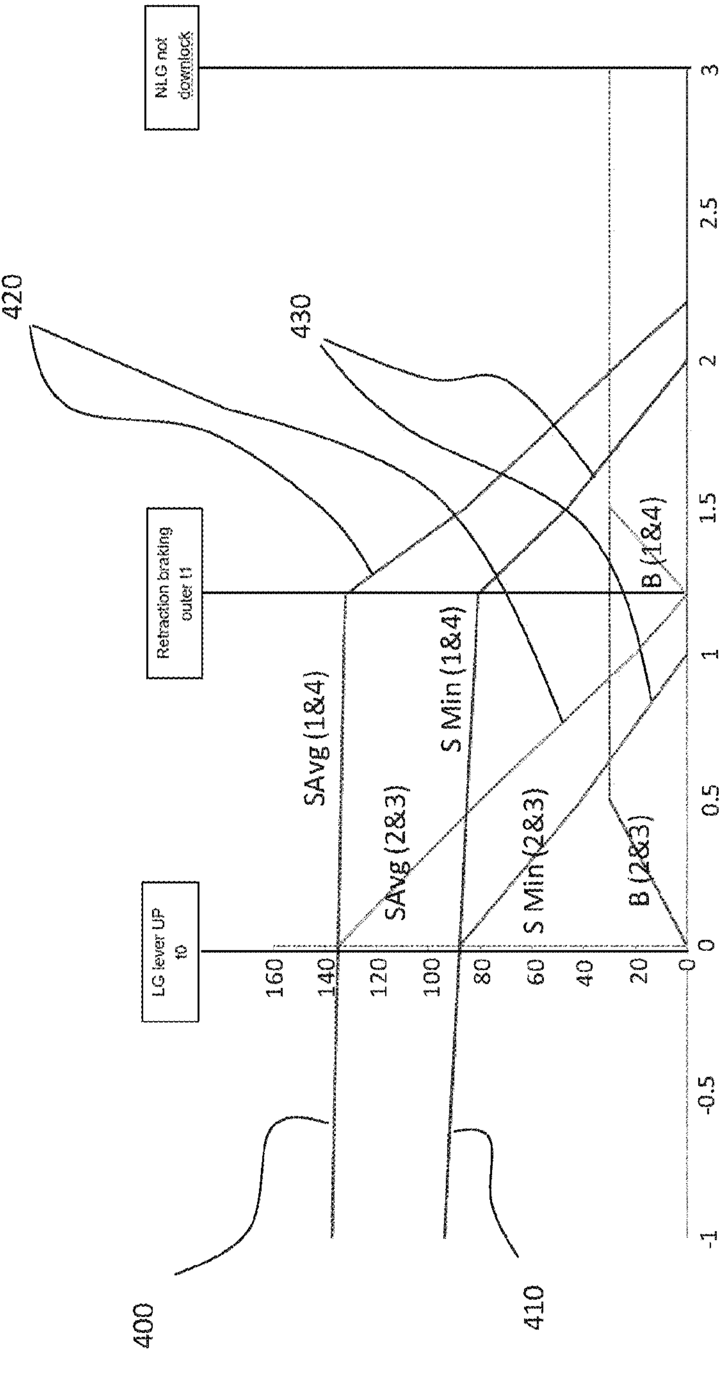
FIG. 4A, 4B and 4C graphically represent the sequential braking in accordance with an embodiment.
Figure 4B:
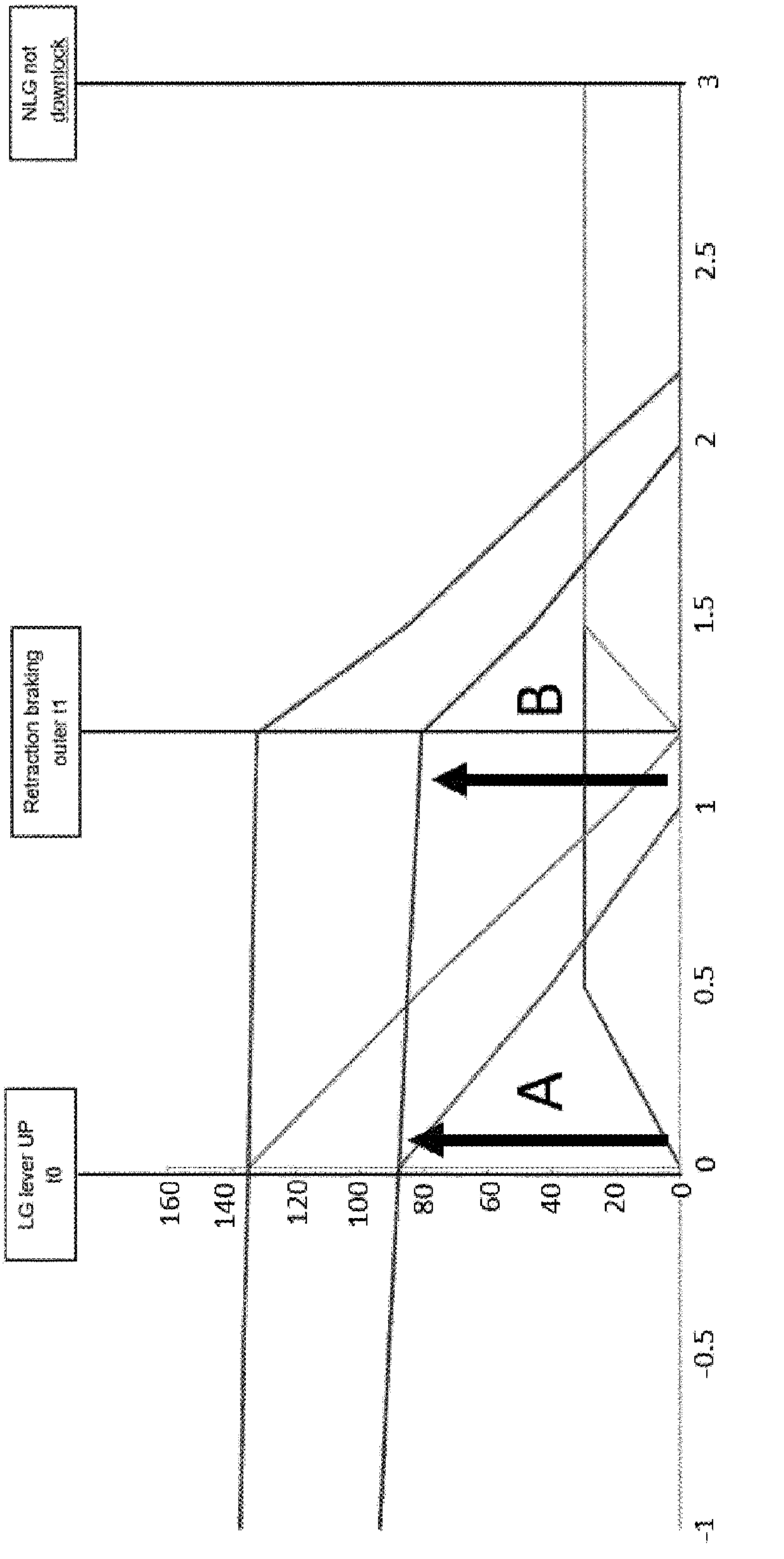
Figure 4C:
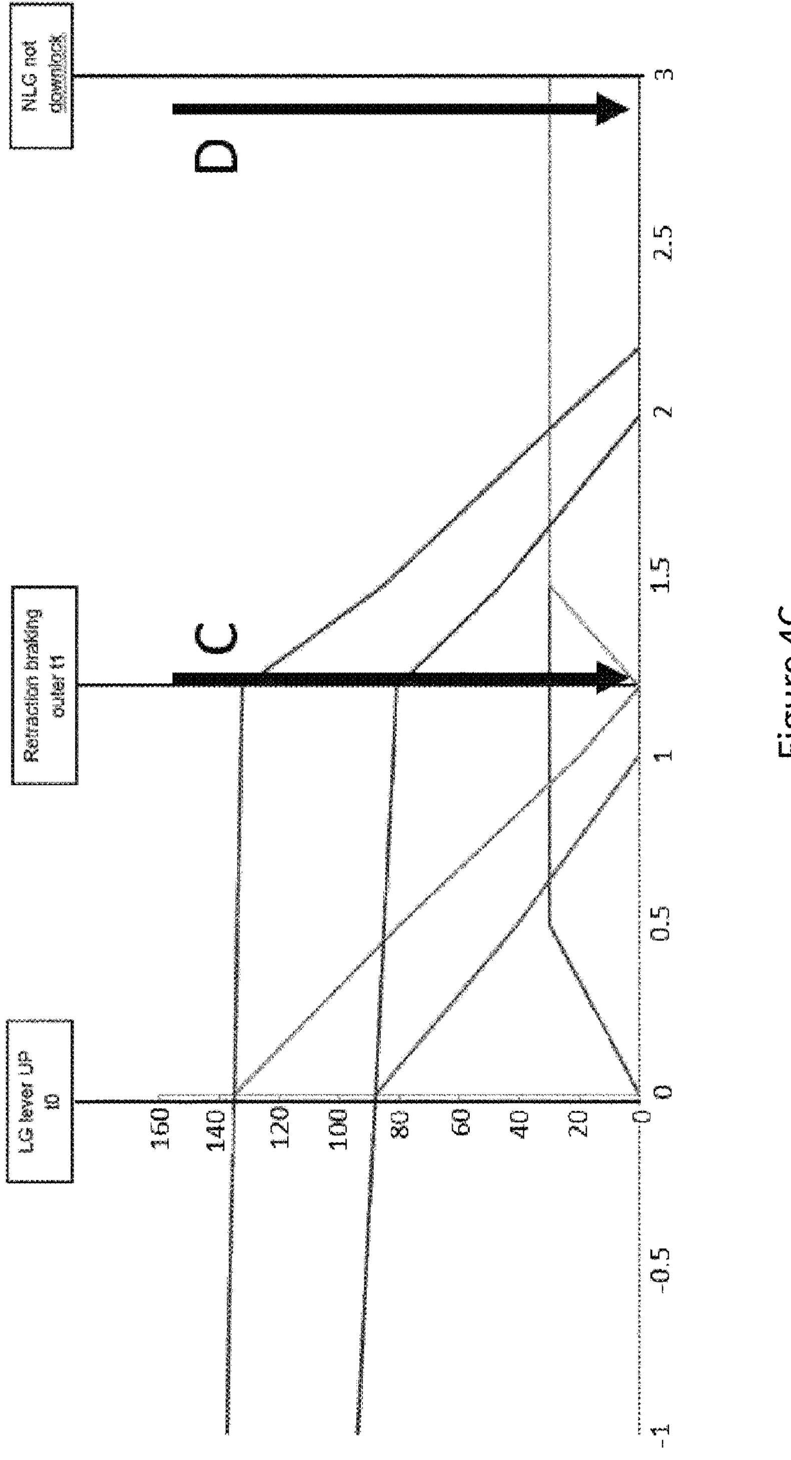

The operation of the sequential braking will now be described with further reference to FIG. 4A to 4C showing a plot of wheel speed and braking with respect to time. The plot shows the time period from a landing gear retraction command being given (at t=0) to the landing gear having been retracted (when a landing gear "not downlock" status is confirmed). In accordance with embodiments of the invention wheels are braked in separate groups with the plot of FIG. 4A showing the braking application for wheels 2 and 3 (the inner wheels of the two main landing gear) starting at t=0 as shown by line B(2&3). The braking of the other wheels is delayed and commences at t=t1 as shown by line B(1&4). The resulting wheel speed under braking is plotted with FIG. 4A showing boundaries for the wheel speed defined by the upper line 400 showing the average speed and 410 showing the average minus 2 standard deviations. The initial left-hand portions of the lines 400 and 410 represent the average wheel conditions with free wheel deceleration. At t=0 landing gear retraction is triggered, and the braking system initiates pre-retraction braking on wheels 2 and 3 (the inner wheels). As shown by lines SAvg(2&3) and SMin(2&3) and SAvg(1&4) and SMin(1&4) the wheels can be expected to follow different deceleration profiles as shown by the lines for the average 420 and minimum 430 (the average less 2 sigma) wheel speed shown in the central region of the plot. At t=t1 the inner wheels can be expected to have stopped rotating and the braking is applied on the outer wheels (1 and 4). The wheels 1 and 4 should then decelerate between the average time bound by line 420 and the average minimum defined by 430.

Several criteria can be identified from plotting the wheel change of speed and will be explained further with respect to FIGS. 4B and 4C. Firstly, as shown in FIG. 4B an initial check may be carried out to confirm that the initial wheel speed has sufficient inertia for the functional brake test and to identify any initial abnormalities. As shown by arrow A, a first criteria may be to confirm that the wheel speed is greater than a threshold minimum value, for example 85 kts in the figure. An initial comparison may also be made between the speed of the wheel groups. For example, if the difference in speed between wheels is greater than 20 kts this can be considered an abnormal asymmetry which may require investigation. The threshold for minimum speed and speed asymmetry may be selected to exclude only a small percentage of outlying cases (for example less than 1%) such that in most cases the functional brake test will proceed.

As shown by arrow B at t=t1 the system may check that the wheel speeds of the inner (2 and 3) wheels, which are intended to have been braked, and outer wheels (1 and 4), which should be freewheeling, are as expected. For example, the freewheel speed may be checked to confirm that the wheel speed of the unbraked wheels (1 and 4) has not decreased by more than a predetermined amount between t=0 and t=t1. This confirms both that the wheel has not been unintentionally braked (i.e. when the command was intended for wheels 2 and 3) and that no other abnormalities have occurred. The controller may also check at this stage that the wheel speed of the already braked wheels (2 and 3) is below a maximum, for example 10 kts. It will be appreciated that these checks would for example allow the controller to identify if a cross-connection has been made.

FIG. 4C illustrates further criteria the controller can apply at the end of the sequential pre-retraction braking. Firstly, as shown by arrow C, the controller may confirm which wheels have been successfully braked at t=t1. The controller may then confirm that all wheels have successfully braked as shown by arrow D at the end of the pre-retraction braking sequence.

Figure 5:
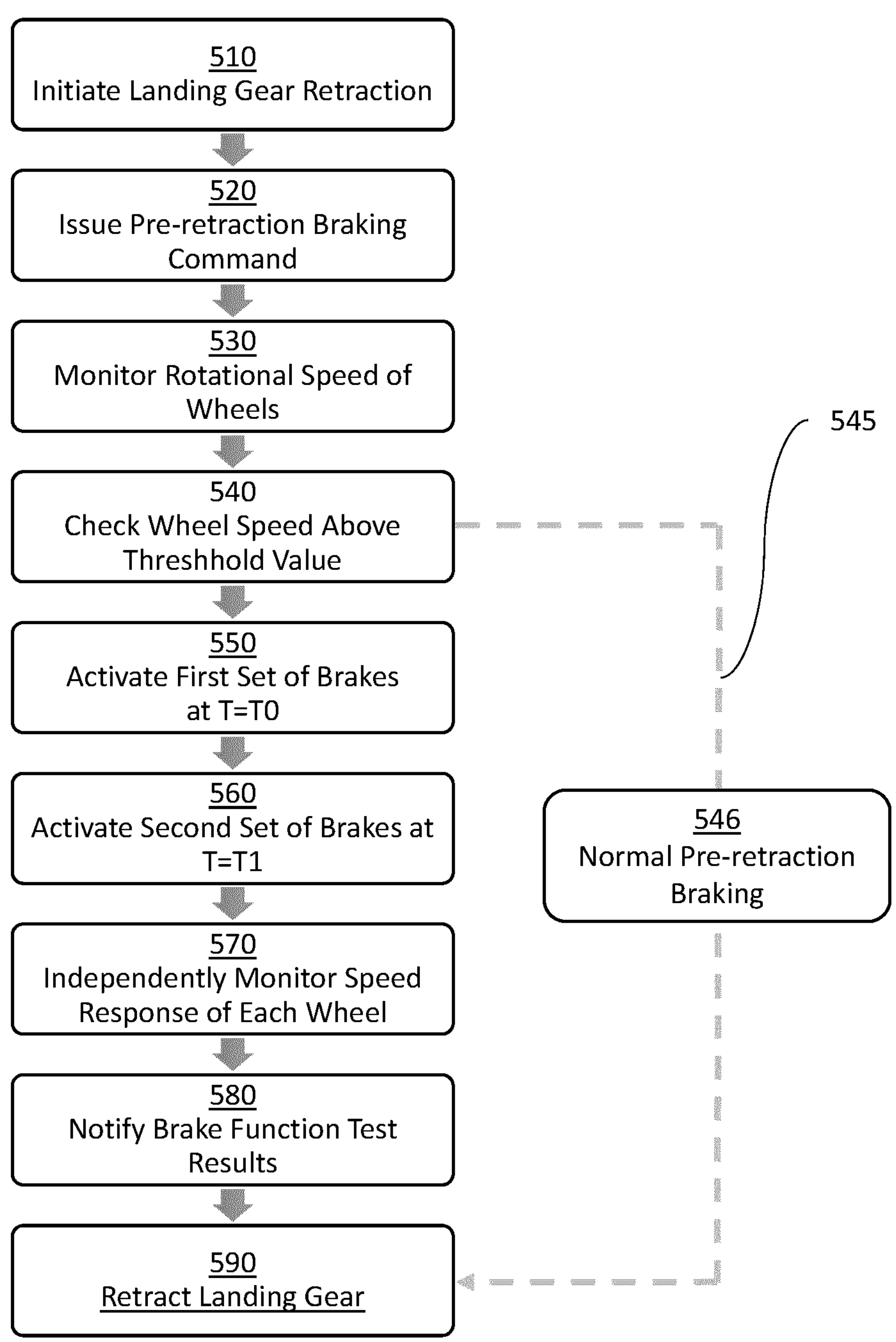
FIG. 5 shows a flow chart of a method in accordance with an embodiment.

A method of embodiments of the invention may be represented by the flow chart of FIG. 5. The method is initiated by a landing gear retraction command being issued in block 510. The brake system executes, in block 520, pre-retracting braking in response to the landing gear retraction. In accordance with embodiments of the invention the pre-retraction braking is executed in parallel with a functional brake test. The brake control system monitors the rotational speed of the landing gear wheels in block 530. An initial check (as discussed above is made to ensure that the wheel speed exceeds a threshold value in block 540. If the threshold value is not exceeded the control system may determine that a functional brake test would be ineffective or unreliable and may skip the tests and proceed with normal pre-retracting braking and subsequent gear retraction as represented by arrow 545 and block 546.

When the threshold has been met in block 540, the controller will activate sequential braking functional test in blocks 550 and 560. As discussed above the sequential brake functional test utilises the wheel speed at take-off so that the tachometer (or other wheel speed sensor) can independently monitor the wheel speed response to the sequential braking in block 570. The results of the brake function test may be notified in block 580, for example if the results show no abnormalities they may be logged or shared with a health monitoring system to assist with predictive maintenance. If the results show an abnormality, they may be flagged to either the flight crew or to through a maintenance system such that corrective action and/or inspection may be carried out. In some embodiments the system may additionally or alternatively implement corrective actions. For example, the system may identify a fault or failure which can be accommodated or mediated. For example, the controller may change a braking mode or may internally reallocate the pairing between cross-connected components such as a tachometer and servo valve pairing.

Finally, the landing gear is retracted in block 590 at the end of the window for pre-retraction braking. At this point all wheels should have been suitably braked (although it will be appreciated that landing gear retraction will occur automatically). In embodiments of the invention the method will be executed in a similar time window to normal pre-retraction braking so as to ensure that the landing gear retraction is not unnecessarily delayed. For example, the total pre-retraction braking time window may be around 2 seconds and as such t1 may be around 1 second.

It is to noted that the term "or" as used herein is to be interpreted to mean "and/or", unless expressly stated otherwise.

Although the invention has been described above with reference to preferred embodiments, it will be appreciated that various changes or modification may be made without departing from the scope of the invention as defined in the appended claims.

The invention claimed is:

1. An aircraft brake control system for controlling a plurality of brakeable wheels of a landing gear on an aircraft, each of the brakeable wheels comprising a brake actuator and a wheel speed sensor, wherein the aircraft brake control system comprises:

a controller configured to receive aircraft control parameters and provide brake commands to the brake actuator of each of the brakeable wheels, wherein the controller is configured to:

activate pre-retraction braking in response to an aircraft control parameter received after take-off, wherein the pre-retraction braking occurs during a period which starts with the take-off and ends at a first initial retraction of the landing gear following the take-off, and wherein the aircraft control parameter indicates that landing gear retraction is required; and execute a functional brake test during the pre-retraction braking, wherein the functional brake test starts after the take-off and is completed during the period; and during the execution of the functional brake test, determine whether each of the brakeable wheels are spinning above a rotational speed threshold, the brakeable wheels include the wheels being braked during the functional brake test and the wheels not being braked or not yet braked during the functional brake test, and wherein the functional brake test comprises:

issuing sequential brake commands to the brake actuators of at least a first brakeable wheel and a second brakeable wheel of the plurality of brakeable wheels to command and cause the braking of at least two of the brakeable wheels to begin in sequence, wherein the brake actuators command and cause the first brakeable wheel to begin braking before braking begins of the second brakeable wheel; and independently monitoring the wheel speed sensors of each of the brakeable wheels to monitor a response of a wheel speed of each of the brakeable wheels to the braking in sequence of the at least two of the brakeable wheels.

2. The aircraft brake control system as claimed in claim 1, wherein the issuing sequential brake commands comprises issuing a first brake command to begin braking the first of the brakeable wheels and issuing a second brake command to begin braking the second of the brakeable wheels a pre-determined time after the first brake command.

3. The aircraft brake control system as claimed in claim 2, wherein the first brake command is issued to a first group of the brakeable wheels including the first brakeable wheel, and the second brake command is issued to a second group of the brakeable wheels including the second brakeable wheel.

4. The aircraft brake control system as claimed in claim 3, wherein the brakeable wheels within the first group of brakeable wheels and the second group of brakeable wheels are selected such that pairs of wheels on the aircraft are in separate groups.

5. The aircraft brake control system as claimed in claim 1, wherein the controller is configured to confirm, after the take-off and prior to the execution of the functional brake test, that a wheel speed indicated by at least one of the wheel speed sensors is above a pre-determined threshold value.

6. The aircraft brake control system as claimed in claim 1, wherein the controller is configured to compare detected speeds indicated by respective ones of the speed sensors.

7. The aircraft brake control system as claimed in claim 1, wherein the controller is configured to issue a notification when a wheel speed detected by one of the wheel speed sensors does not conform to an expected response speed under the brake actuation commands issued during the functional brake test.

8. The aircraft brake control system as claimed in claim 1, wherein the controller is configured to adapt at least one control parameter in response to the functional brake test.

9. An aircraft landing gear system comprising:

a plurality of wheels, each having:

a brake including a brake actuator, and a wheel speed sensor a gear retraction mechanism; and the aircraft brake control system as claimed in claim 1.

10. An aircraft comprising a plurality of brakeable wheels, each brakeable wheel comprising a brake actuator and a wheel speed sensor, and the aircraft brake control system as claimed in claim 1.

11. The aircraft brake control system of claim 1, wherein the functional brake test further comprises determining an abnormality based on the monitoring of the wheel speed sensors.

12. The aircraft brake control system of claim 11, wherein the functional brake test further comprises implementing a corrective action including at least one of changing a braking mode or reallocating a pairing of cross-connected components.

13. The aircraft brake control system of claim 11, wherein the functional brake test further comprises reallocating a pairing of a cross-connected tachometer and servo valve.

14. The aircraft brake control system of claim 1, wherein the brake command to the brake actuator of the second brakeable wheel is issued after the first brakeable wheel has stopped spinning.

15. A method of operating an aircraft braking system, the aircraft braking system including a plurality of brakeable wheels on an aircraft, each of the brakeable wheels comprising a brake actuator and a wheel speed sensor, the method comprising:

performing a functional brake test during pre-retraction braking in response to a landing gear retraction command after take-off of the aircraft, wherein the functional brake test is completed before commencement of an initial retraction of the landing gear in response to the landing gear retraction command, wherein the functional brake test comprises:

monitoring a speed of each of the brakeable wheels;

sequentially activating the brake actuators of the brakeable wheels to sequentially begin braking a first brakeable wheel of the brakeable wheels before braking begins in a second brakeable wheel of the brakeable wheels;

monitoring a response of the wheel speed of each of the brakeable wheels to the sequential brake actuation, and during the execution of the functional brake test, determining whether each of the brakeable wheels are spinning above a rotational speed threshold, the brakeable wheels include the wheels being braked during the functional brake test and the wheels not being braked or not yet braked during the functional brake test.

16. The method of claim 15, wherein the method further comprises checking, after the take-off, the speed of each of the brakeable wheel is above a threshold value prior to performing the functional brake test.

17. The method of claim 15, further comprising performing the functional brake test on a plurality of groups of the brakeable wheels, and wherein at least one of the brakeable wheels in each of the groups is tested non-concurrently with another brakeable wheel in the corresponding group.

18. The method of claim 17, further comprising testing at least one of the brakeable wheels in a first of the groups concurrently with at least one of the brakeable wheels in a second of the groups.

19. The method of claim 15, wherein the sequential activation on the brake actuator for a second of the brakeable wheels occurs after a first of the brakeable wheels has stopped spinning.

20. The method of claim 15, wherein the monitoring the speed of each of the brakeable wheels includes monitoring the wheels being braked during the functional brake test and monitoring the wheels not being braked or not yet braked during the functional brake test.

* * * * *